United States Patent
Srinivasan et al.

(10) Patent No.: US 12,028,024 B2
(45) Date of Patent: Jul. 2, 2024

(54) SYSTEM AND METHOD OF MITIGATING INTERFERENCE CAUSED BY COUPLING FROM POWER AMPLIFIER TO VOLTAGE-CONTROLLED OSCILLATOR

(71) Applicant: Silicon Laboratories Inc., Austin, TX (US)

(72) Inventors: Rangakrishnan Srinivasan, Austin, TX (US); Mustafa H. Koroglu, Austin, TX (US); Zhongda Wang, Sunnyvale, CA (US); Francesco Barale, North Kingstown, RI (US); Abdulkerim L Coban, Austin, TX (US); John M. Khoury, Austin, TX (US); Sriharsha Vasadi, Austin, TX (US); Michael S. Johnson, Austin, TX (US); Vitor Pereira, Austin, TX (US)

(73) Assignee: Silicon Laboratories Inc., Austin, TX (US)

( * ) Notice: Subject to any disclaimer, the term of this patent is extended or adjusted under 35 U.S.C. 154(b) by 11 days.

(21) Appl. No.: 16/705,868

(22) Filed: Dec. 6, 2019

(65) Prior Publication Data

US 2021/0175855 A1    Jun. 10, 2021

(51) Int. Cl.
*H03F 1/26* (2006.01)
*H03B 5/04* (2006.01)
(Continued)

(52) U.S. Cl.
CPC .............. *H03F 1/26* (2013.01); *H03B 5/04* (2013.01); *H03F 1/30* (2013.01); *H03F 3/245* (2013.01);
(Continued)

(58) Field of Classification Search
CPC ... H03B 5/04; H03F 1/30; H03F 1/301; H03F 1/302; H03F 1/303; H03F 1/304;
(Continued)

(56) References Cited

U.S. PATENT DOCUMENTS

| 8,704,604 B2 * | 4/2014 | Schoepf | H03B 5/32 331/158 |
| 9,000,856 B1 * | 4/2015 | Pancholi | H03L 1/022 331/176 |

(Continued)

FOREIGN PATENT DOCUMENTS

| CN | 1650512 A | 8/2005 |
| CN | 110476352 A | 11/2019 |

OTHER PUBLICATIONS

Bashir, Imran et al. "A Novel Approach for Mitigation of RF Oscillator Pulling in a Polar Transmitter." IEEE Journal of Solid-State Circuits, vol. 46, No. 2, Feb. 2011. pp. 403-415 (Year: 2011).*

(Continued)

*Primary Examiner* — Patrick C Chen
(74) *Attorney, Agent, or Firm* — Gary Stanford; Huffman Law Group, PC

(57) ABSTRACT

A transmitter including a frequency synthesizer with a voltage-controlled oscillator that provides an oscillating signal, a programmable delay circuit that delays the oscillating signal to provide a delayed oscillating signal, a power amplifier that is configured to use the delayed oscillating signal for transmitting a signal, and a delay controller that programs the delay circuit with a delay time that reduces interference caused by coupling from the power amplifier to the voltage-controlled oscillator. The delay circuit may be programmed to reduce control voltage change of the voltage-controlled oscillator as a function of delay change, and/or to reduce phase noise degradation at an output of the transmitter as a function of delay change. The delay may be (Continued)

adjusted based on detected operating temperature. A calibration value may be determined at a calibration frequency, in which a frequency offset may be determined based on a selected channel frequency.

25 Claims, 10 Drawing Sheets

(51) Int. Cl.
 *H03F 1/30* (2006.01)
 *H03F 3/24* (2006.01)
 *H03K 5/00* (2006.01)
(52) U.S. Cl.
 CPC ......... *H03K 5/00* (2013.01); *H03F 2200/375* (2013.01); *H03K 2005/00019* (2013.01)
(58) Field of Classification Search
 CPC .... H03F 1/305–309; H03F 3/245; H03F 1/26; H03F 1/28
 See application file for complete search history.

(56) References Cited

U.S. PATENT DOCUMENTS

| | | | | |
|---|---|---|---|---|
| 10,574,186 | B1* | 2/2020 | Emira | .................. H03B 5/1209 |
| 11,159,186 | B2 | 10/2021 | Emira et al. | |
| 2005/0070231 | A1 | 3/2005 | Jensen | |
| 2006/0095221 | A1* | 5/2006 | Salmi | ............... G01R 31/31922 |
| | | | | 702/106 |
| 2006/0121858 | A1* | 6/2006 | Tanaka | ................. H04B 1/0003 |
| | | | | 455/76 |
| 2009/0207941 | A1* | 8/2009 | Osman | .................... H04L 27/12 |
| | | | | 375/302 |
| 2012/0139647 | A1 | 6/2012 | Schoepf et al. | |
| 2013/0002357 | A1* | 1/2013 | Thomsen | ............. H03G 3/3042 |
| | | | | 330/279 |
| 2015/0326326 | A1* | 11/2015 | Nobbe | ...................... H03F 1/30 |
| | | | | 375/224 |
| 2018/0188317 | A1* | 7/2018 | Maiellaro | ............. G01S 7/4056 |
| 2018/0316337 | A1* | 11/2018 | Tsai | ....................... H03K 5/133 |

OTHER PUBLICATIONS

Bashir, Imran et al. "An Edge Transmitter with Mitigation of Oscillator Pulling." 2010 IEEE Radio Frequency Integrated Circuits Symposium, Anaheim, CA, USA. 2010 pp. 13-16. Doi: 10.1109/RFIC.2010.5477247. (Year: 2010).*

Adler, Robert. "A Study of Locking Phenomena in Oscillators." Proceedings of the IEEE, vol. 61, No. 10, Oct. 1973. pp. 1380-1385.

Hajimiri, Ali et al. "A General Theory of Phase Noise in Electrical Oscillators." IEEE Journal of Solid-State Circuits, vol. 33, No. 2, Feb. 1998. pp. 179-194.

Razavi, Behzad. "A Study of Injection Locking and Pulling in Oscillators." IEEE Journal of Solid-State Circuits, vol. 39, No. 9, Sep. 2004. pp. 1415-1424.

Bashir, Imran et al. "A Novel Approach for Mitigation of RF Oscillator Pulling in a Polar Transmitter." IEEE Journal of Solid-State Circuits, vol. 46, No. 2, Feb. 2011. pp. 403-415.

Bashir, Imran et al. "An Edge Transmitter with Mitigation of Oscillator Pulling." 2010 IEEE Radio Frequency Integrated Circuits Symposium, Anaheim, CA, USA. 2010 pp. 13-16. Doi: 10.1109/RFIC.2010.5477247.

Seegerer, Georg et al. "EDGE Transmitter with Commercial GSM Power Amplifier Using Polar Modulation with Memory Predistortion." IEEE MTT-S International Microwave Symposium Digest, 2005. Long Beach, CA. 2005, pp. 1553-1556.

Youssef, Michael et al. "A Low-Power GSM/EDGE/WCDMA Polar Transmitter in 65-nm CMOS" IEEE Journal of Solid-State Circuits, vol. 46, No. 12. Dec. 2011. pp. 3061-3074.

* cited by examiner

| TEMP (°C) | TPROP (ps) | TVCO (ps) | TMOD (ps) | DELAY | TCOMP (ps) | TPHPA2VCO (ps) | TMAR_LO (ps) | TMAR_HI (ps) |
|---|---|---|---|---|---|---|---|---|
| -40 | 939 | 182 | 28 | 4 | 64 | 92 | -46 | 45 |
| -35 | 944 | 182 | 33 | 3 | 48 | 81 | -36 | 55 |
| -25 | 954 | 182 | 43 | 3 | 49 | 92 | -46 | 45 |
| -15 | 963 | 182 | 53 | 2 | 33 | 85 | -40 | 51 |
| -5 | 973 | 182 | 62 | 2 | 33 | 95 | -49 | 42 |
| 5 | 982 | 182 | 71 | 1 | 17 | 88 | -42 | 49 |
| 15 | 991 | 182 | 80 | 1 | 17 | 97 | -52 | 40 |
| 25 | 1000 | 182 | 89 | 0 | 0 | 89 | -44 | 47 |
| 35 | 1009 | 182 | 98 | 0 | 0 | 98 | -52 | 39 |
| 45 | 1018 | 182 | 107 | 4 | 69 | 176 | -39 | 52 |
| 55 | 1026 | 182 | 115 | 4 | 70 | 185 | -48 | 43 |
| 65 | 1035 | 182 | 124 | 3 | 53 | 177 | -40 | 51 |
| 75 | 1043 | 182 | 132 | 3 | 53 | 185 | -49 | 42 |
| 85 | 1051 | 182 | 140 | 2 | 36 | 176 | -39 | 52 |
| 95 | 1059 | 182 | 148 | 2 | 36 | 184 | -48 | 43 |
| 105 | 1067 | 182 | 156 | 1 | 18 | 174 | -38 | 53 |
| 115 | 1075 | 182 | 164 | 1 | 18 | 182 | -46 | 45 |
| 125 | 1083 | 182 | 172 | 0 | 0 | 172 | -35 | 56 |
| 135 | 1091 | 182 | 180 | 0 | 0 | 180 | -43 | 48 |

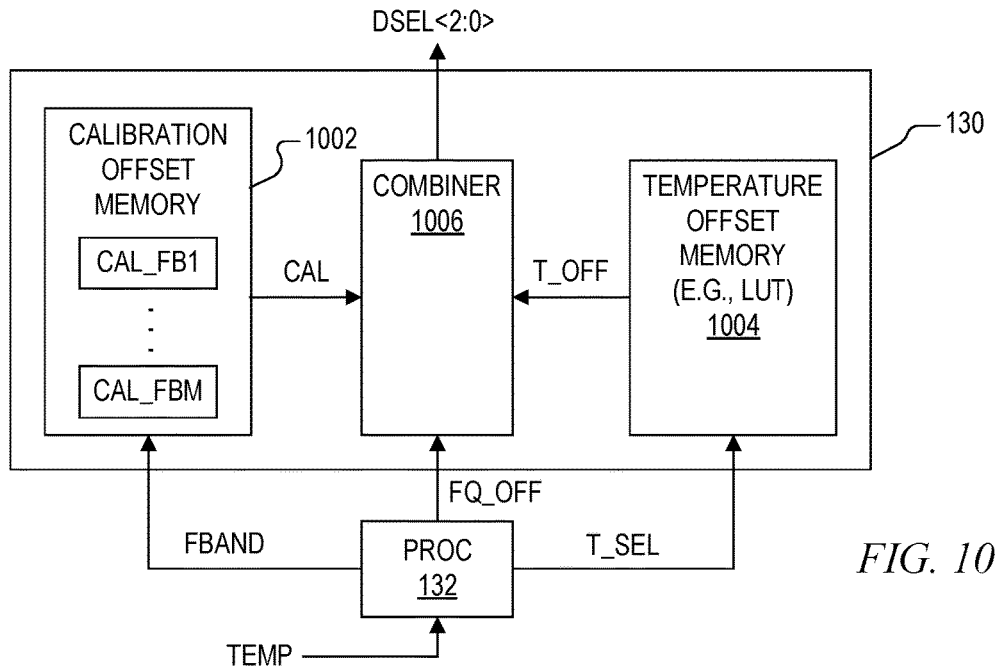
FIG. 10
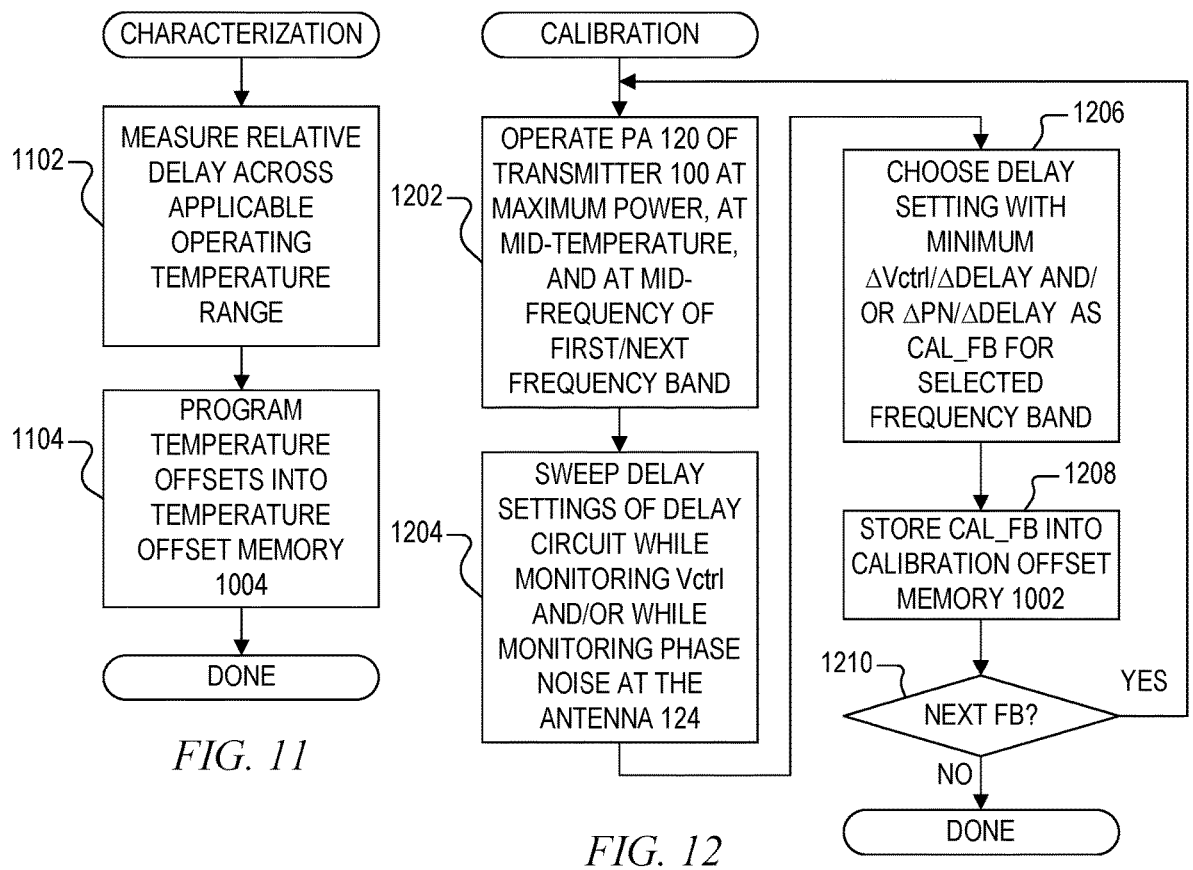
FIG. 11
FIG. 12

SYSTEM AND METHOD OF MITIGATING INTERFERENCE CAUSED BY COUPLING FROM POWER AMPLIFIER TO VOLTAGE-CONTROLLED OSCILLATOR

BACKGROUND OF THE INVENTION

Field of the Invention

The present invention relates in general to communication systems, and more particularly to a system and method of mitigating interference caused by power amplifier harmonic coupling into a voltage-controlled oscillator of a transmitter.

Description of the Related Art

A transmitter of a communication device may include a frequency synthesizer or phase-locked loop (PLL) with a voltage-controlled oscillator (VCO) and a power portion including a power amplifier (PA). In the present disclosure, the frequency synthesizer may be a radio-frequency (RF) synthesizer, although embodiments described herein are not limited to RF configurations. The frequency of the VCO is often divided by an integer factor N to develop the transmission frequency of the PA. PA to VCO "pulling" may occur because of magnetic coupling involving the inductances of the PA and VCO, be it actual passive inductors or current-carrying supply loops of the respective sections, particularly when the PA is transmitting at a high power level. PA to VCO coupling can be detrimental to fundamental operation of the transmitter. It can affect the control voltage of the frequency synthesizer itself to be outside of the linear range of the varactor causing modulation errors in the transmitter and may further cause stability issues of the PLL. It can also induce phase noise degradation by affecting the VCO phase noise to potentially deteriorate emissions and violate transmit spectral masks. Additionally, the phase noise degradation can also affect the in-band error vector magnitude (EVM) for the transmitter. This degradation can be pronounced in transmitters employing narrow-band PLL-based synthesizers, which is often a preferred design choice to meet phase noise specifications.

The interference caused by PA to VCO coupling might be mitigated by employing a higher frequency separation between the PA and the VCO, but this causes higher current consumption in the VCO and the local oscillator (LO) chain. The output power from the on-chip PA could be reduced, but an external front-end-module would be required to achieve desired power levels at significant additional cost and board area/footprint. A wide-band synthesizer could be employed, but such synthesizers increase undesired emissions due to a higher phase noise. Magnetically differential inductors in the VCO may be used, but such inductors consume significantly higher silicon area. The inductance-capacitance or L-C based VCO could be replaced by a ring-oscillator which is usually less susceptible to coupling effects. However, the ring-oscillators suffer from higher phase noise. The PA and the VCO sections could also be spatially separated to minimize the coupling; such increase in spatial separation, however, is often not feasible in transceivers that use advanced semiconductor fabrication technologies with finer geometry processes. Advanced fabrication technologies are advantageous to minimize silicon area, to reduce cost and to reduce current consumption.

SUMMARY OF THE INVENTION

A transmitter according to one embodiment of the present disclosure includes a frequency synthesizer including a voltage-controlled oscillator that provides an oscillating signal, a programmable delay circuit that delays the oscillating signal to provide a delayed oscillating signal, a power amplifier that is configured to use the delayed oscillating signal for transmitting a signal, and a delay controller that programs the delay circuit with a delay time that reduces interference caused by coupling from the power amplifier to the voltage-controlled oscillator.

The delay circuit may be digitally programmed to select an integer number of delay steps, in which a total number of delay steps and a duration of each delay step is determined based on a period of the oscillating signal for each of multiple oscillation frequencies of operation. The delay controller may program the delay circuit to reduce control voltage change of the voltage-controlled oscillator as a function of delay change. In addition or in the alternative, the delay controller may program the delay circuit to reduce phase noise degradation at an output of the transmitter as a function of delay change.

The delay controller may adjust the delay circuit based on a propagation delay between the voltage-controlled oscillator and the power amplifier and a frequency of the voltage-controlled oscillator. The delay controller may adjust the delay circuit based on a detected operating temperature. The delay controller may combine a calibration value with a channel frequency offset and a temperature offset to determine a delay select value used to program the delay circuit.

The delay controller may include a memory that stores multiple temperature offsets based on detected temperature, and a combiner that combines a calibration value to a selected temperature offset and to a frequency offset to provide a delay select value used to program the delay circuit. The memory may store multiple calibration values each determined by a corresponding one of one or more frequency bands of transmission, in which a calibration value is chosen based on a selected frequency band of transmission.

The transmitter may include processing circuitry that calculates and provides the frequency offset based on a calibrated propagation delay between the voltage-controlled oscillator and the power amplifier and a frequency difference between a channel frequency and a calibration frequency used to determine the calibrated propagation delay. The processing circuitry may select from among the temperature offsets based on detected temperature. The temperature offsets may be determined based on measuring delay across an applicable operating temperature range relative to a calibration temperature and an incremental delay step.

A method of mitigating interference in a transmitter caused by coupling from a power amplifier to a voltage-controlled oscillator according to one embodiment of the present disclosure includes generating, by a frequency synthesizer including the voltage-controlled oscillator, an oscillating signal, and delaying the oscillating signal by an amount that reduces interference caused by coupling from a power amplifier to the voltage-controlled oscillator when the power amplifier is using the delayed oscillating signal for transmission.

The method may include selecting an integer number of delay steps in which a total number of delay steps and a duration of each delay step is determined based on a period of the oscillating signal for each of multiple oscillation frequencies of operation. The method may include delaying to reduce a control voltage change of the voltage-controlled oscillator as a function of delay change. The method may include delaying to reduce a phase noise degradation at an output of the transmitter as a function of delay change.

The method may include delaying based on a propagation delay between the voltage-controlled oscillator and the power amplifier and a frequency of the voltage-controlled oscillator. The method may include delaying based on a detected operating temperature. The method may include combining a calibration value with a channel frequency offset and a temperature offset. The method may include selecting a temperature offset based on a temperature value indicative of detected temperature, calculating a frequency offset based on a propagation delay between the voltage-controlled oscillator and the power amplifier at a calibration frequency and a difference between the calibration frequency and a channel frequency, and combining the temperature offset and the frequency offset with a calibration value.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

FIG. 9 is a table illustrating temperature compensation from $-40°$ C. to $135°$ C. for a VCO operating at about 5.49 GHz for a 915 MHz transmitter according to one embodiment of the present disclosure.

FIG. 10 is a simplified block diagram of the delay controller of FIG. 1 interfaced with the processing circuitry according to one embodiment of the present disclosure.

FIG. 11 is a flowchart diagram illustrating a characterization process for determining the temperature offsets to be stored in the temperature offset memory of FIG. 10 according to one embodiment of the present disclosure.

FIG. 12 is a flowchart diagram of a calibration procedure of the transmitter circuit of FIG. 1 according to one embodiment of the present disclosure.

DETAILED DESCRIPTION

The interference caused by magnetic coupling between the power amplifier (PA) and the voltage-controlled oscillator (VCO) in a transmitter can be detrimental to the transmit operation. The harmonic current in the aggressor PA is linked to the victim VCO current, that is, the instantaneous current in the VCO L-C tank by a certain gain and phase factor. The delay between the VCO and PA in the transmit local oscillator (LO) chain affects the coupling between the PA to VCO through the phase factor. It modulates the VCO L-C tank and creates a shift in the effective tank capacitance, and thereby affects the instantaneous frequency and the resulting feedback control voltage in the RF synthesizer. The coupling depends on the delay between the VCO and PA with the zero crossings periodically appearing every half period of the VCO. Around the zero crossings, the phase noise degradation becomes severe due to PA injection into the VCO in a high gain region. The degradation is at a maximum at the zero-crossing and improves symmetrically when operation is moved by delay, away from the zero-crossing. A related behavior is that circuit noise injections around the zero crossings of the VOSC signal degrade the phase noise of the VCO.

By employing a delay circuit between the VCO and the PA in the transmit LO chain, the delay can be adjusted to move the coupling away from the zero-crossing regions with sufficient margin to mitigate the noise amplification. The delay circuit does not affect the output power or efficiency of the PA. The sensor can be the derivative of the response of the control voltage of the PLL to the delay, enabling fast on-chip calibrations with an auxiliary analog-to-digital converter (ADC). For a digital PLL with an L-C based digitally controlled oscillator (DCO), the digital word from the digital filter can be directly monitored. The delay may also be determined by measuring the phase noise degradation versus the programmed delay at the antenna port using an external signal analyzer or receiver and minimizing the sensitivity. When placed in the region around the peaks of the $\Delta f_{vco}$ in open loop waveform, the phase noise of the synthesizer has minimal sensitivity to temperature and output power of the PA, as the coupling sensitivity function to phase factor or the gain for the noise injection is small, ideally zero.

Figure 1:
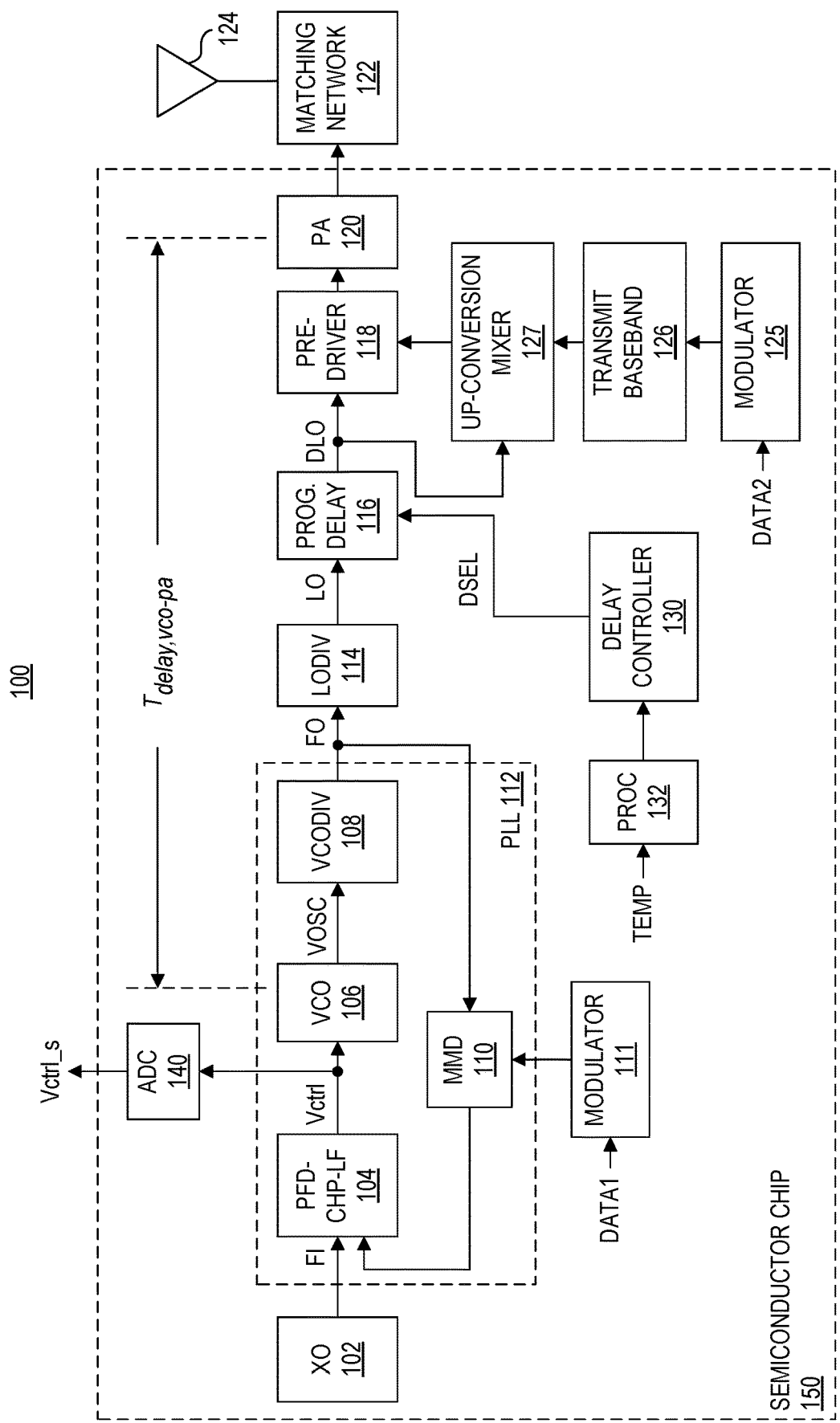
FIG. 1 is a simplified block diagram of a transmitter circuit including a programmable delay circuit that mitigates interference caused by coupling from the PA to the VCO according to one embodiment of the present disclosure.

FIG. 1 is a simplified block diagram of a transmitter circuit 100 including a programmable delay circuit 116 that mitigates interference caused by PA to VCO coupling according to one embodiment of the present disclosure. A crystal oscillator (XO) 102 provides an oscillating input frequency signal FI to a first input of a phase-frequency detector and charge pump low-pass filter (PFD-CHP-LF) 104. The PFD-CHP-LF 104 provides a control voltage $V_{ctrl}$ to an input of an inductor-capacitor L-C VCO 106, having an output providing a signal VOSC to an input of a frequency divider (VCODIV) 108 that divides the output frequency of the VOSC signal by an integer factor to provide an output frequency signal FO. FO is fed back to an input of a multi-modulus divider (MMD) 110, having an output provided to a control input of the PFD-CHP-LF 104. The PFD-CHP-LF 104, the VCO 106, the VCODIV 108 and the MMD 110 collectively form a phase-locked loop (PLL) 112, which is not further described other than to state that the PLL 112 is a frequency synthesizer that converts the input FI signal to the output FO signal and maintains FO at a desired frequency level.

FO is provided to an input of an LO divider (LODIV) 114, having an output providing an LO signal to an input of the delay circuit 116. The delay circuit 116 has an output providing a delayed LO signal DLO to an input of a pre-driver circuit 118, which has an output coupled to an input of a PA 120. The output of the PA 120 is coupled to the input of a matching network 122, having an output provided to an antenna 124 via an antenna port. The XO 102, the PLL 112, the LODIV 114, the delay circuit 116, the pre-driver circuit 118 and the PA 120 may be integrated on a semiconductor chip 150 as shown, although the physical crystal of the XO 102 may be off-chip and coupled to an on-chip driver circuit. The matching network 122 and the antenna 124 are shown provided off-chip such as mounted to a printed circuit board (PCB) or the like (not shown). However, either the matching network 122 or the antenna 124 or both can be on the semiconductor chip 150, depending upon the frequency of operation and other design considerations.

A first modulator 111 receives first data DATA1 and has an output provided to an input of the MMD 110. The first modulator 111 may be used for direct in-loop modulation based transmitters applicable for constant-envelope modulation schemes only. A second modulator 125 receives second data DATA2 and has an output provided to an input of a transmit baseband circuit 126, having an output provided to an input of an up-conversion mixer 127. The transmit baseband circuit 126 may include digital-to-analog conversion and filtering functions. The up-conversion mixer 127 receives DLO and has an output provided to the pre-driver circuit 118. The second modulator 125 may be used for linear up-conversion transmitters employing amplitude, variable-envelope and/or constant-envelope modulation schemes. The first and second modulators 111 and 125, the transmit baseband circuit 126 and the up-conversion mixer 127 may also be provided on the semiconductor chip 150 as shown.

In general operation of the transmitter circuit 100, the DLO signal developed by the XO 102, the PLL 112, the LODIV 114 and the delay circuit 116 is used directly by the pre-driver circuit 118 (for schemes using the first modulator 111) or by the up-conversion mixer 127 and then the pre-driver circuit 118 (for schemes using the second modulator 125) and the PA 120 to output an RF signal, which is provided through the matching network 122 for transmission by the antenna 124. The matching network 122 provides impedance matching between the output of the PA 120 and the antenna 124 to maximize power transmission efficiency.

The transmitter circuit 100 generally represents RF transmitters operating at RF frequencies including sub-Gigahertz (sub-GHz), 2.4 GHz or 5 GHz, such as, for example, Zigbee, Z-wave, Wi-Fi, Bluetooth (including Bluetooth low energy or BLE), Cellular 3G, 4G-LTE (Long Term Evolution), etc. The output power of the PA 120 of the semiconductor chip 150 may be up to 20 decibel-milliwatts (dBm) for some configurations. The transmitter circuit 100 may support various modulation schemes, such as constant-envelope Binary Phase Shift Keying (BPSK), Frequency Shift Keying (FSK), Minimum-Shift Keying (MSK), Gaussian MSK (GMSK), Offset-Quadrature Phase Shift Keying (O-QPSK) and/or variable-envelope schemes such as QPSK, Quadrature Amplitude Modulation (QAM), and Orthogonal Frequency-Division Multiplexing (OFDM).

Conventional transmitter circuits do not include the delay circuit 116, so that the LO signal is typically provided directly to the pre-driver circuit 118 or the up-conversion mixer 127 in prior art configurations. As described further herein, magnetic coupling may occur between the inductances of the PA 120 and the VCO 106, be it actual passive inductors or current-carrying loops of the respective sections, particularly when the PA 120 is transmitting at a high power level. The VCODIV 108 and the LODIV 114 divide down the frequency of the VCO by a factor of N. PA to VCO coupling can be detrimental to fundamental operation of the transmitter circuit 100 when the Nth harmonic of the PA 120 couples into the VCO 106. It can affect the voltage level of $V_{ctrl}$ to be outside of the linear range of the varactor (not shown) within the VCO 106 causing modulation errors and may further cause stability issues of the PLL 112. It can also induce phase noise degradation by affecting the VCO phase noise to potentially deteriorate emissions and violate transmit spectral masks. Additionally, the phase noise degradation can also affect the in-band error vector magnitude (EVM) for the transmitter circuit 100, particularly for the PLL 112 which is more pronounced in narrow-band PLL-based synthesizer. Conventional solutions of PA to VCO coupling are either not applicable or have been deemed inadequate.

The coupling depends upon a VCO-PA delay from the VCO 106 to the PA 120, shown as $T_{delay,vco-pa}$, so that an adjustment of the VCO-PA delay may mitigate PA-VCO coupling interference. The transmitter circuit 100 further includes a delay controller 130 providing a DSEL value used to program the delay circuit 116 to minimize PA-VCO coupling and thus interference caused by the Nth harmonic of the PA 120. The VCO-PA delay is usually not a design parameter and may vary from one transmitter design to another or even from one semiconductor chip to another for a given transmitter design. A calibration process may be performed to determine a calibration value used as an initial value for DSEL. The coupling is also affected by the frequency of operation, which may include a selected frequency band and may further include a selected channel frequency within the selected frequency band. A Zigbee transmitter, for example, may operate in an 800 MHz band or a 900 MHz band depending upon the applicable jurisdiction. Thus, a separate calibration value may be determined for each frequency band and stored into a calibration offset memory 1002 (FIG. 10). The transmitter circuit 100 includes processing circuitry (PROC) 132 that determines the frequency band of operation, in which the processing circuitry 132 may select the applicable calibration value. The processing circuitry 132 further determines a channel frequency of transmission and thus calculates a channel frequency offset value to more accurately adjust the delay. The processing circuitry 132 may be implemented in any suitable manner, such as a processor, a microcontroller, a finite state machine, etc.

In addition, the coupling is also affected by the temperature of operation. A sampling of a batch of semiconductor chips of a particular design may be characterized to determine the relative sensitivity to temperature within an applicable temperature range of operation. This is used to program a temperature offset memory 1004 (FIG. 10). The processing circuitry 132 monitors temperature via a TEMP value and converts to a select value used to select a temperature offset to further fine-tune the delay. The TEMP value may be provided by an on-chip temperature sensor (not shown) or may be derived from an off-chip temperature sensor (not shown) measuring ambient temperature.

Various methods are available for calibrating the transmitter circuit 100 for temperature and frequency. In one embodiment, the $V_{ctrl}$ signal is monitored during calibration operation as further described herein. An analog to digital converter (ADC) 140 may be provided on the semiconductor chip 150 having an input receiving the $V_{ctrl}$ signal and an output providing a corresponding digital value $V_{ctrl\_s}$. If the PLL 112 is instead a digital design, then the ADC 140 may be omitted since the digital word from the digital loop filter may be directly monitored. In addition, or in the alternative, the phase noise (PN) may be measured during operation by a PN signal analyzer or the like (not shown) coupled at the port of the antenna 124.

Figure 2:
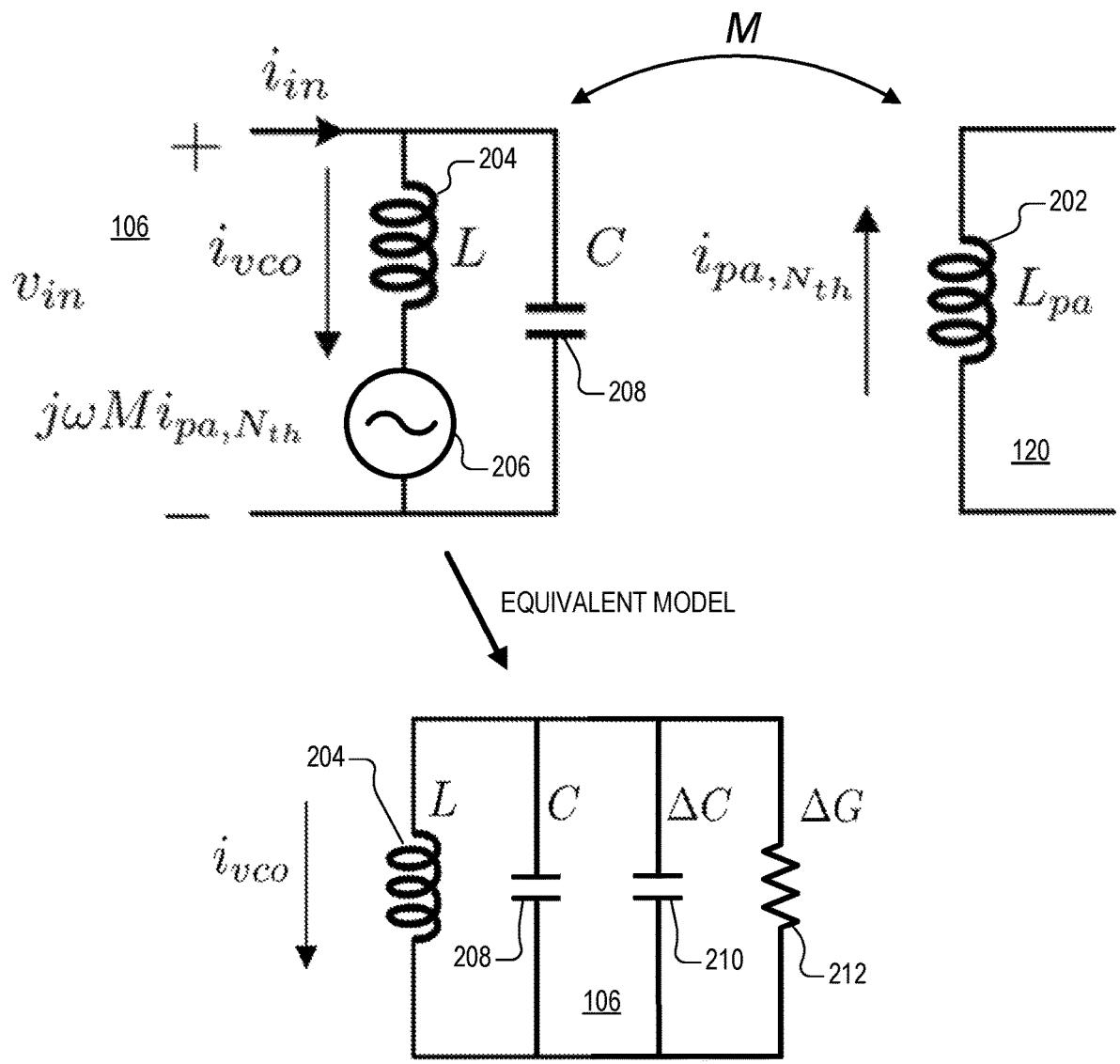
FIG. 2 is a figurative schematic diagram illustrating magnetic coupling that exists between the PA and the VCO of FIG. 1 according to one embodiment of the present disclosure.

FIG. 2 is a figurative schematic diagram illustrating magnetic coupling that exists between the PA 120 and the VCO 106 according to one embodiment of the present disclosure. The PA 120 supply current or output current coupling mechanism to the VCO 106 is modelled as an inductor 202 with inductance $L_{pa}$ having a current $i_{pa,Nth}$ which is an Nth harmonic of the frequency of the PA 120 during transmission, and equivalent to the VCO frequency. Magnetic coupling between the PA 120 and the VCO 106 is illustrated by a double-arrow labeled M referencing mutual inductance between the inductor 202 of the PA 120 and an inductor 204 of the VCO 106 having inductance L with a current $i_{vco}$. The VCO 106 is modelled as the inductor 204 in series with a voltage source 206 which are collectively in parallel with a capacitor 208 having a capacitance C. The voltage source 206 is not a physical device but represents a voltage $j\omega M i_{pa,Nth}$ that is induced through the inductor 204 because of the current $i_{pa,Nth}$ flowing through the inductor 202 of the PA 120, where $\omega$ is radial frequency, $i_{pa,Nth} = -i_{vco} \cdot \alpha e^{j\phi_t}$ at a frequency $f_{vco}$ of the VCO 106 in which "·" denotes multiplication, $\alpha$ is a gain factor, and $\phi_t$ is a phase factor that is proportional to the VCO-PA delay $T_{delay,vco-pa}$.

An equivalent model of the of the VCO 106 is shown in which the voltage source 206 is replaced by a capacitor 210 having a capacitance $\Delta C$ and a resistor 212 having a conductance $\Delta G$ coupled in parallel with the inductor 204 and the capacitor 208. Using Kirchhoff's Current Law (KCL) to solve for $\Delta C$ and $\Delta G$, $\Delta C = -(M/L)\alpha \cdot \cos(\phi_t) \cdot C$, and $\Delta G = (M/L)\alpha \cdot \sin(\phi_t) \cdot \omega C$. It is noted that although $\Delta G$ is a contributing factor as it affects the loss of the L-C tank leading to phase noise degradation, it is ignored for the embodiments described herein since the value of $\Delta G$ is very small by design. The $\Delta G$ factor may be considered in alternative embodiments when larger having a more significant impact.

Figure 3:
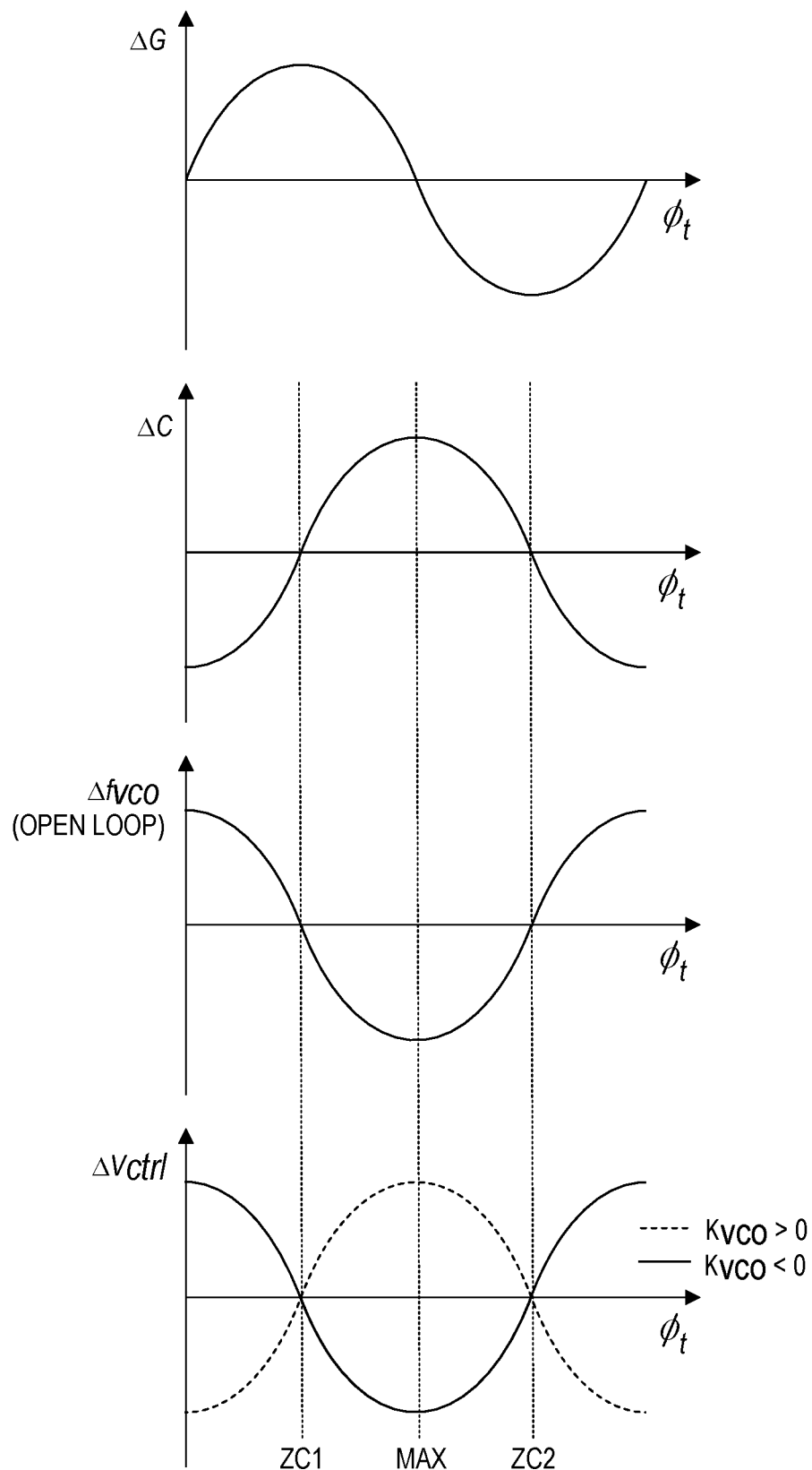
FIG. 3 shows a set of timing diagrams plotting values $\Delta G$, $\Delta C$, $\Delta f_{vco}$ in open loop, and $\Delta V_{ctrl}$ versus a phase factor $\phi_t$ for a full cycle from 0 to $2\pi$ (or a full cycle of $\Delta C$) according to one embodiment of the present disclosure.

FIG. 3 shows a set of phase diagrams plotting the values $\Delta G$, $\Delta C$, $\Delta f_{vco}$ (open loop), and $\Delta V_{ctrl}$ (for positive or negative VCO gain $K_{vco}$) versus the phase factor $\phi_t$ for a full cycle from 0 to $2\pi$ (or a full cycle of $\Delta C$) according to one embodiment of the present disclosure. The variable $\Delta f_{vco}$ represents the relative change of frequency of the VCO 106 caused by $\Delta C$, and the variable $\Delta V_{ctrl}$ represents the relative change of the control voltage $V_{ctrl}$ output to maintain the same frequency of the VCO 106 by cancelling the change caused by $\Delta C$. The polarity of $\Delta V_{ctrl}$ depends on the polarity of the gain $K_{vco}$ of the VCO 106, which may be positive or negative. The $\Delta C$, $\Delta f_{vco}$, and $\Delta V_{ctrl}$ curves are synchronized with each other in which each cross zero (0) at the same phase shift, shown as a first zero-crossing ZC1 and a second zero-crossing ZC2. The $\Delta C$, $\Delta f_{vco}$, and $\Delta V_{ctrl}$ curves also reach a maximum or minimum level shown as at MAX. $\Delta G$ is 90° out of phase with respect to the other curves.

It has been determined that around the zero crossings, such as ZC1 and ZC2, the phase noise degradation gets severe due to noise injection into the VCO in a high gain region. The degradation is maximum at the zero-crossing and improves symmetrically when operation is moved by delay away from the zero-crossing. In this manner, it is desired to adjust the delay of the delay circuit 116 to avoid ZC1 and ZC2 and to be as close as practically possible to MAX.

Figure 4:
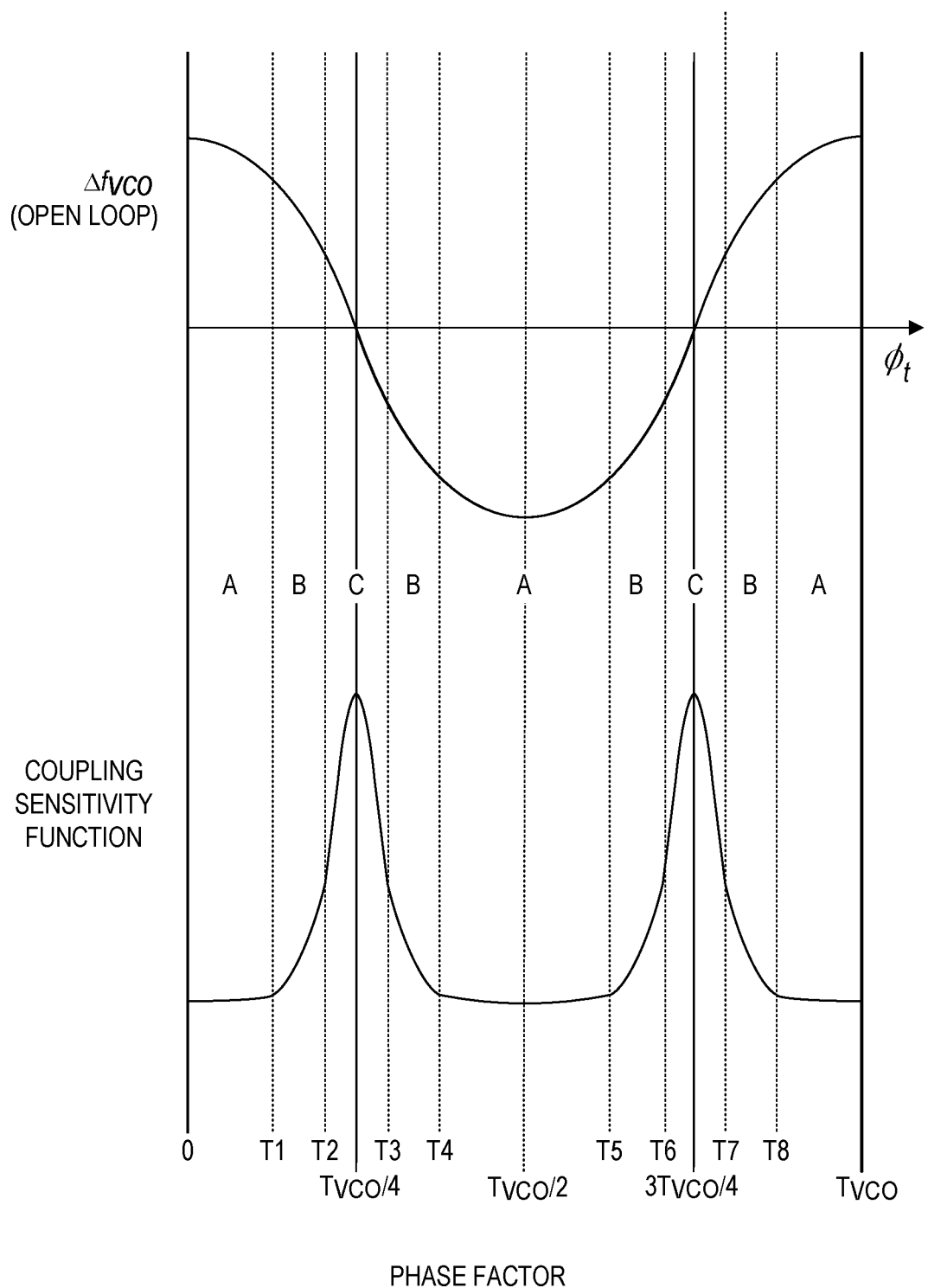
FIG. 4 includes a first graph plotting $\Delta f_{vco}$ in open loop and a second graph plotting the coupling sensitivity function versus one cycle of the phase factor according to one embodiment of the present disclosure, in which the phase factor $\phi_t$ corresponds with a full period $T_{VCO}$ of the VOSC signal at the output of the VCO of FIG. 1 from 0 to a VCO period $T_{VCO}$.

FIG. 4 includes a first graph plotting $\Delta f_{vco}$ in open loop and a second graph plotting the coupling sensitivity function, both versus one cycle of the phase factor $\phi_t$ according to one embodiment of the present disclosure, in which the phase factor $\phi_t$ corresponds with a full period $T_{VCO}$ of the VOSC signal at the output of the VCO 106 from 0 to $T_{VCO}$. The $\Delta f_{vco}$ in open loop is directly related to $\Delta C$, so that it is desired to avoid the zero-crossings where the slope of $\Delta f_{vco}/\Delta\phi_t$ is high. The phase noise increases near and reaches a maximum at the zero-crossings of $\Delta f_{vco}$ in open loop waveform, which corresponds to the region with maximum gain of $\Delta C/\Delta\phi_t$ for the coupling sensitivity function. The phase noise decreases near and reaches a minimum at the minimum or maximum values of $\Delta f_{vco}$ in open loop waveform, which corresponds to a minimum gain of $\Delta C/\Delta\phi_t \sim 0$ for the coupling sensitivity function. The coupling sensitivity function versus phase factor is divided into 3 regions, including a region C when at or near a zero-crossing of $\Delta f_{vco}$ in open loop waveform with maximum gain for noise injection, a region A when at or near a minimum or maximum of $\Delta f_{vco}$ in open loop waveform with minimum gain for noise injection, and a region B located between the A and C regions.

As shown in FIG. 4, for the half cycle of $\Delta f_{vco}$ in open loop from 0 to $T_{VCO}/2$, the coupling sensitivity function is in region A from 0 to a time T1 (corresponding to the minimum gain region for noise injection), the coupling sensitivity function is in region B from T1 to a time T2 (corresponding to a region between the minimum and maximum gains for noise injection), the coupling sensitivity function is in region C from T2 to T3 (corresponding with the zero-crossing of $\Delta f_{vco}$ in open loop waveform occurring at $T_{VCO}/4$ and the maximum gain region for noise injection), the coupling sensitivity function is in region B from T3 to T4 (corresponding to a region between the minimum and maximum gains for noise injection), and the coupling sensitivity function is in region A from T4 to $T_{VCO}/2$ (corresponding to the minimum gain region for noise injection). The pattern of the coupling sensitivity function repeats for the second half cycle of $\Delta f_{vco}$ in open loop from $T_{VCO}/2$ to $T_{VCO}$, in which the coupling sensitivity function is in region A from $T_{VCO}/2$ to T5, the coupling sensitivity function is in region B from T5 to T6, the coupling sensitivity function is in region C from T6 to T7 (for the next zero-crossing of the $\Delta f_{vco}$ in open loop waveform), the coupling sensitivity function is in region B from T7 to T8, and the coupling sensitivity function is in region A from T8 to $T_{VCO}$.

The delay circuit 116 is designed to adjust the VCO-PA delay $T_{delay,vco-pa}$ from the VCO 106 to the PA 120 relative to the period $T_{VCO}$ of the VOSC signal to move to that A region for any operable range of frequency $F_{VCO}$ of the VCO 106 and for the full temperature operating range. For many configurations, the frequency of the VCO 106 is divided by a factor of N to the frequency $F_{LO}$ of the local oscillator signal LO. For sub-GHz operation, N is typically 6, so that local oscillator frequencies $F_{LO}$ at or near 900 MHz (including frequencies from 850 MHz to 950 MHz) have a VCO frequency $F_{VCO}$ of about 5400 MHz with a corresponding VCO period $T_{VCO}$ of about 185 picoseconds (ps). For 2.4 GHz operation, N is typically 2, so that local oscillator frequencies $F_{LO}$ at or near 2400 MHz have a VCO frequency $F_{VCO}$ of about 4800 MHz with a corresponding VCO period $T_{VCO}$ of about 208 ps. The delay circuit 116 is designed with sufficient range (of at least $T_{VCO}/2$) and resolution, or number of delay steps, and with a corresponding delay time per delay step to adjust for any frequency or temperature variations for VCO operation in the 5 GHz frequency range, in this embodiment.

Figure 5:
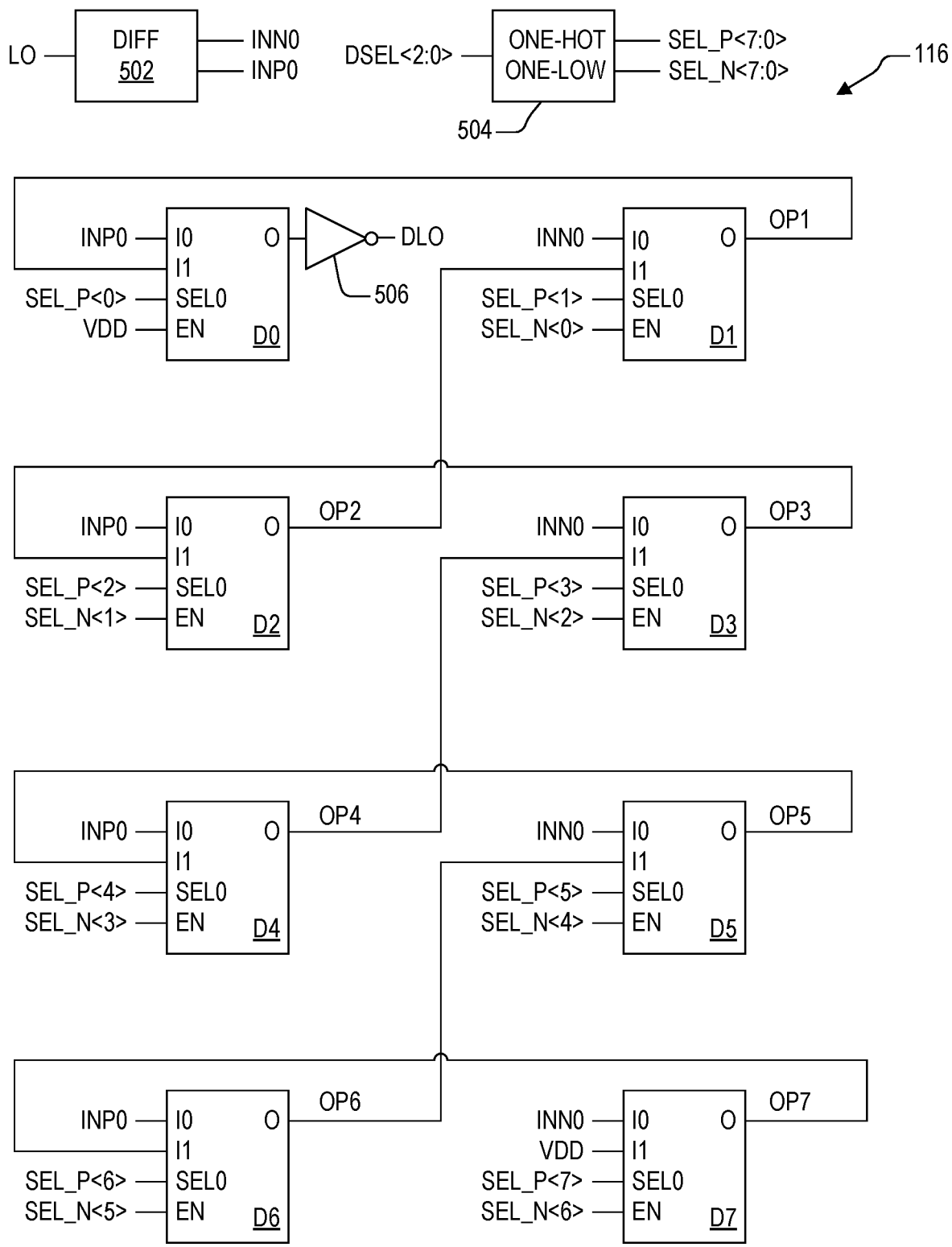
FIG. 5 is a simplified block diagram of the delay circuit of FIG. 1 implemented according to one embodiment of the present disclosure.

FIG. 5 is a simplified block diagram of the delay circuit 116 implemented according to one embodiment of the present disclosure. The LO signal is provided to an input of a differential (DIFF) circuit 502 which converts a single-ended LO signal to a differential signal INN0/INP0. It is noted that the DIFF circuit 502 may not be provided for some configurations in which the LO signal is already provided in differential form. The DSEL signal is shown as a 3-bit digital value DSEL<2:0> to achieve a resolution of 8 different delay settings from 0 (000b) to 7 (111b) in which "b" denotes a binary value. DSEL<2:0> is provided to respective inputs of a decoder 504 which converts DSEL<2:0> to a one-hot select value SEL_P<7:0> and a one-low select value SEL_N<7:0>. As an example, for DSEL<2:0>=001b, SEL_P<7:0>=00000001b and SEL_N<7:0>=11111110b.

The delay circuit 116 further includes a series of 8 delay cells D7, D6, D5, D4, D3, D2, D1, and D0 (D7-D0) as shown. Each delay cell D7-D0 includes a pair of inputs I0 and I1, a select input SEL0, an enable input EN, and an output O. The I0, I1, SEL0, and EN inputs of the delay cell D7 are INN0, VDD, SEL_P<7>, and SEL_N<6>, and the output O of the delay cell D7 provides a signal OP7 (in which VDD represents a logic high level or logic 1). The I0, I1, SEL0, and EN inputs of the delay cell D6 are INP0, OP7, SEL_P<6>, and SEL_N<5>, and the output O of the delay cell D6 provides a signal OP6. The I0, I1, SEL0, and EN inputs of the delay cell D5 are INN0, OP6, SEL_P<5>, and SEL_N<4>, and the output O of the delay cell D5 provides a signal OP5. The I0, I1, SEL0, and EN inputs of the delay cell D4 are INP0, OP5, SEL_P<4>, and SEL_N<3>, and the output O of the delay cell D4 provides a signal OP4. The I0, I1, SEL0, and EN inputs of the delay cell D3 are INN0, OP4, SEL_P<3>, and SEL_N<2>, and the output O of the delay cell D3 provides a signal OP3. The I0, I1, SEL0, and EN inputs of the delay cell D2 are INP0, OP3, SEL_P<2>, and SEL_N<1>, and the output O of the delay cell D2 provides a signal OP2. The I0, I1, SEL0, and EN inputs of the delay cell D1 are INN0, OP2, SEL_P<1>, and SEL_N<0>, and the output O of the delay cell D1 provides a signal OP1. The I0, I1, SEL0, and EN inputs of the delay cell D0 are INP0, OP1, SEL_P<0>, and VDD, and the output O of the delay cell D0 is coupled to the input of an inverter 506, having an output providing the delayed LO signal DLO.

Operation of the delay circuit 116 shown in FIG. 5 is now briefly described. It is noted that the output of each of the delay cells D7 to D1 is provided to one of the inputs of a sequential delay cell to form a daisy chain of delay cells, referred to as a delay chain. The binary value of DSEL <2:0> identifies an activated one of the delay cells D7-D0, in which the remaining higher-numbered delay cells are effectively deactivated and the remaining lower-numbered delay cells form a delay chain to propagate the delayed signal from the activated delay cell down to the last delay cell D0. For example, a binary value of DSEL <2:0>=111b activates delay cell D7 and enables the remaining delay cells D6-D0 into a delay chain to delay the signal by a total of 7 delay steps. A binary value of DSEL <2:0>=100b activates delay cell D4, deactivates delay cells D7-D5, and enables the remaining delay cells D3-D0 into a delay chain to delay the signal by a total of 4 delay steps. A binary value of DSEL <2:0>=000b only activates the last delay cell D0 for a minimum delay.

Figure 6:
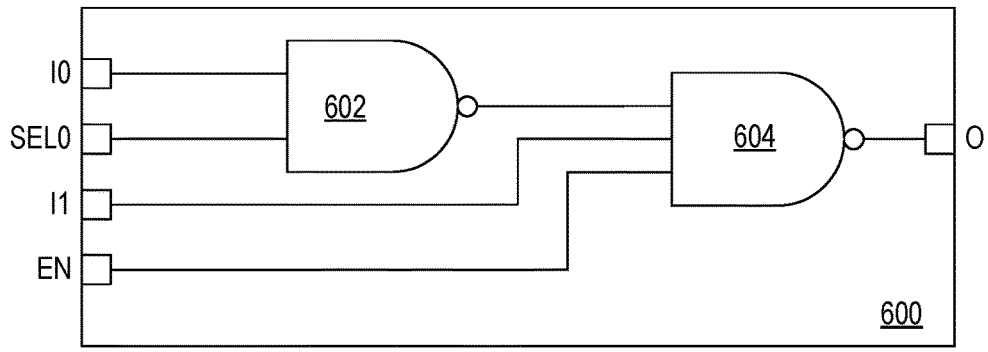
FIG. 6 is a schematic diagram of a delay cell implemented according to one embodiment of the present disclosure, which may be used as one or more of the delay cells of FIG. 5.

FIG. 6 is a schematic diagram of a delay cell 600 implemented according to one embodiment of the present disclosure, which may be used as any one up to all of the delay cells D7-D0. The I0 and SEL0 inputs are provided to respective inputs of a 2-input Boolean NAND gate 602, having an output coupled to one input of a 3-input Boolean NAND gate 604. The I1 and EN inputs are provided to the other 2 inputs of the NAND gate 604, having an output providing the O output of the delay cell 600. Each of the delay cells D7-D0 may be configured according to the delay cell 600. In one embodiment, the delay of the delay cell 600 is approximately 17 ps, so with a total of 7 delay steps a total delay of 119 ps is achieved which is suitable for most transmitter circuits operating with a VCO in the 5 GHz range. The number of delay steps and the delay of each delay cell may be adjusted for any transmitter circuit configuration.

Figure 7:
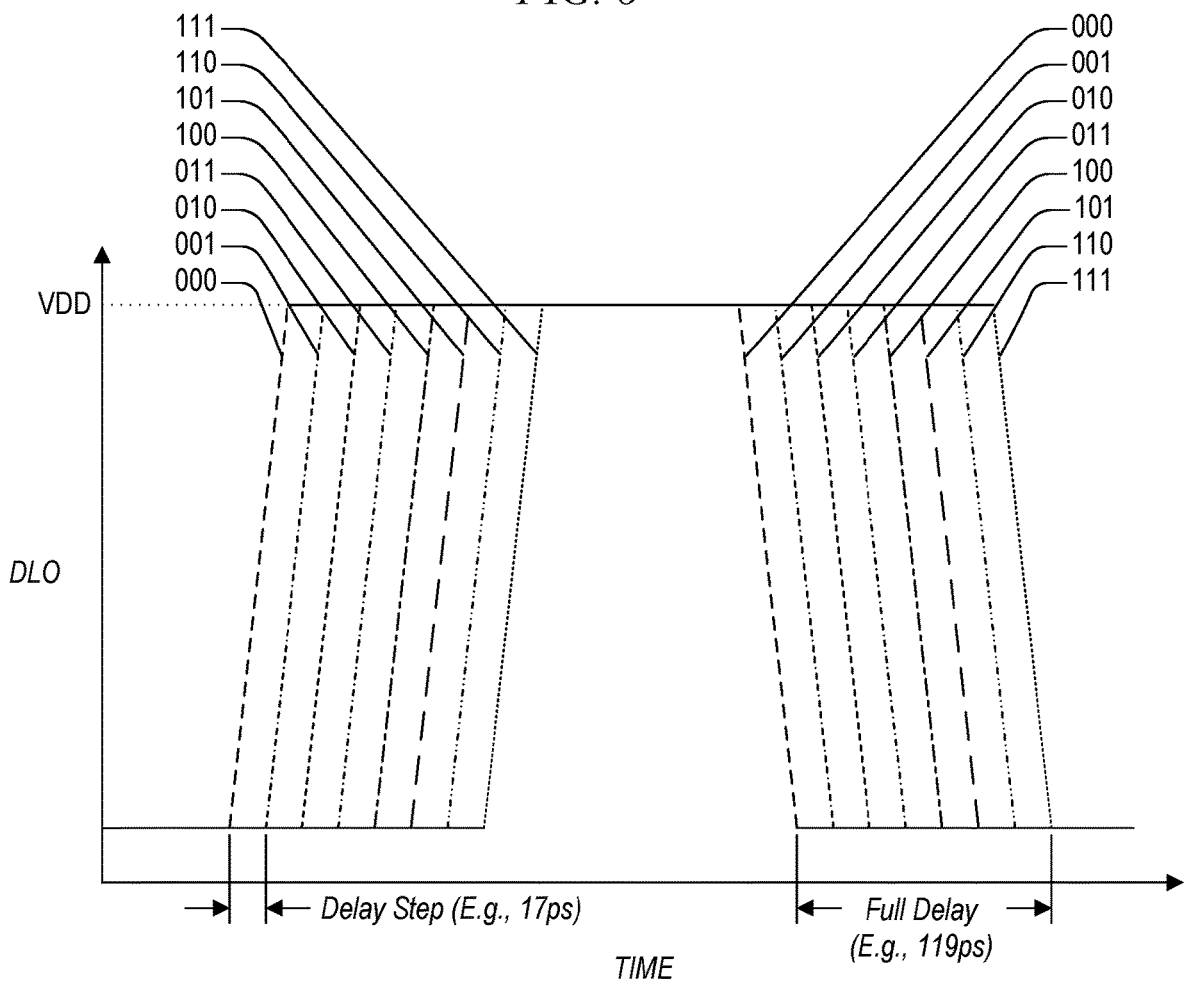
FIG. 7 is a graphic diagram plotting the amplitude of one cycle of the DLO signal versus time for each setting of the DSEL<2:0> signal for the delay circuit of FIG. 1 configured according to the embodiments of FIGS. 5 and 6.

FIG. 7 is a simplified graphic diagram plotting the amplitude of one cycle of the DLO signal versus time for each setting of the DSEL<2:0> signal for the delay circuit 116 configured according to the embodiments of FIGS. 5 and 6. The first plot is for DSEL<2:0>=000b, the second plot is for DSEL<2:0>=001b, and so on up to a last plot for DSEL<2:0>=111b. The delay between each plot is a delay step up to a full delay from the first plot to the last plot. For example, the delay step may be 17 ps up to a total delay of 119 ps.

Figure 8:
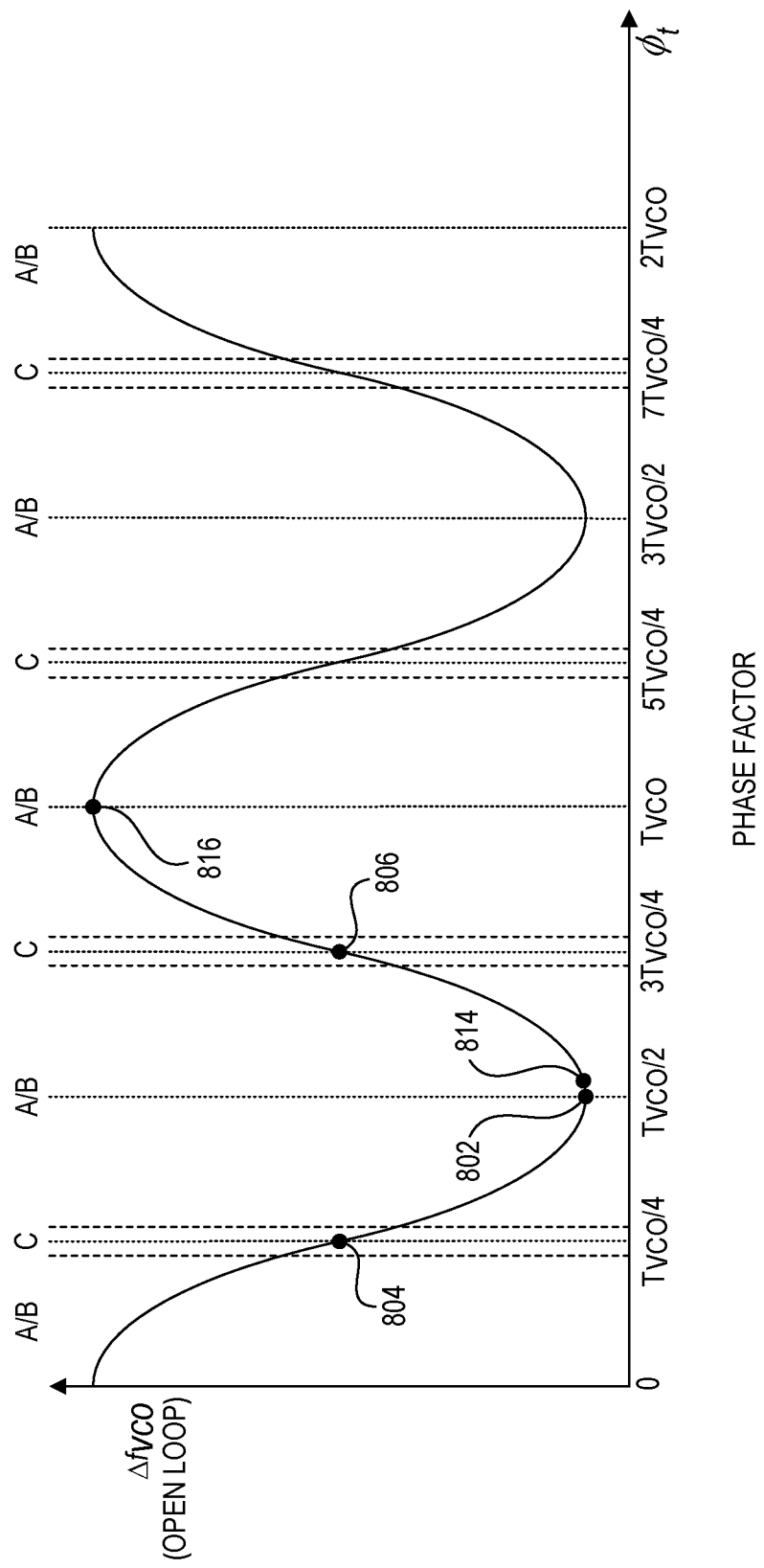
FIG. 8 is a plot of $\Delta f_{vco}$ in open loop versus phase factor $\phi_t$ for 2 VCO cycles illustrating calibration for temperature compensation according to one embodiment of the present disclosure.

FIG. 8 is a plot of $\Delta f_{vco}$ in open loop versus phase factor $\phi_t$ for 2 VCO cycles (0 to $2T_{VCO}$) illustrating calibration for temperature compensation according to one embodiment of the present disclosure. Each pair of vertical lines outline region C on either side of each zero-crossing of $\Delta f_{vco}$ in open loop waveform. The area between each pair of vertical lines correspond with regions A or B, shown as A/B, with region A in the center and region B approaching but still outside the C regions.

A first point 802 along the $\Delta f_{vco}$ in open loop waveform corresponds with uncompensated operation at a room temperature of 25 centigrade (° C.), a second point 804 corresponds with uncompensated operation at a cold temperature of about −25° C., and a third point 806 corresponds with uncompensated operation at a hot temperature of about 85° C. Clearly, uncompensated operation at 25° C. falls near phase factor $T_{VCO}/2$ in region A in which interference caused by PA to VCO coupling is at a minimum level. As the temperature decreases, uncompensated operation may be acceptable until approaching and reaching −25° C. at point 804 at a phase factor of $T_{VCO}/4$ centered within region C. Similarly, as the temperature increases from 25° C. towards 85° C., uncompensated operation is acceptable until approaching and reaching −25° C. at point 806 at a phase factor of $3T_{VCO}/4$ again centered within another region C. In this manner, it is noted that temperature changes the phase factor which in turn changes $\Delta f_{vco}$ in open loop so that temperature should be compensated at those temperatures in which $\Delta f_{vco}$ in open loop is at or near region C.

For this configuration, uncompensated operation at room temperature of 25° C. is centered within the A region so that compensation near room temperature is not necessary. Thus, temperature compensation means adding a delay of zero so that "compensated" operation is the same and thus falls on point 802. A fourth point 814 corresponds with compensated operation at the cold temperature of about −25° C., which is at about phase factor $T_{VCO}/2$ very near point 802 within region A. A fifth point 816 corresponds with compensated operation at the hot temperature of about 85° C., which is at about phase factor $T_{VCO}$ which is again within region A. In this manner, delay can be added or reduced to move operation out of region C into region A or at least region B for certain temperature values or ranges.

In a more specific embodiment with a VCO frequency of about 5.49 GHz for a 915 MHz transmitter (with a frequency divide factor of N=6) so that $T_{VCO}$=182 ps, and a delay circuit that provides a delay in about 17 ps increments, 2-3 delay periods may be added for operation at the cold temperature of about −25° C. and the hot temperature of about 85° C. As further described herein, the number of delay periods may be adjusted for other temperature values or ranges.

FIG. 9 is a table 900 illustrating temperature compensation from −40° C. to 135° C. for a VCO operating at about 5.49 GHz for a 915 MHz transmitter according to one embodiment of the present disclosure. The temperature (TEMP in ° C.) is shown in subranges which differ by 10° C. except at the extreme cold temperature subrange of 5° C. from −40° C. to −35° C. The VCO-PA propagation delay $T_{delay,vco-pa}$ is shown as $T_{PROP}$ in picoseconds (ps), the VCO period $T_{VCO}$ is 182 ps, a modulo delay for the effective uncompensated phase factor is shown as $T_{MOD}$ in ps, the number of delay intervals added by the delay circuit 116 is shown as DELAY, the corresponding compensation delay value is shown at $T_{COMP}$ in ps, and the resulting phase factor is shown as $T_{PHPA2VCO}$ in ps. The table 900 also shows a first margin $T_{MAR\_LO}$ in ps and a second margin $T_{MAR\_H1}$ in ps indicating the delay difference between each compensated phase factor and the center of the C regions on either side. The added delay $T_{COMP}$ is determined to keep the phase factor $T_{PHPA2VCO}$ at or sufficiently near the A regions. The worst case margin shown in table 900 occurs at 125° C. with a first margin of −35 ps and a second margin of 56 ps in which the modulo delay value is 172. A margin of 35 ps is healthy for the transmitter. In this case, the delay is 0 and thus uncompensated which is sufficient since the uncompensated value is in or very near the A region and sufficiently distant from the C region.

The propagation delay $T_{PROP}$ changes with temperature while the VCO period $T_{VCO}$ remains fixed at about 182 ps, so that the corresponding modulo delay, for the effective uncompensated phase factor, $T_{MOD}$ changes as well. $T_{MOD}$ may be calculated as $T_{PROP}$ % $T_{VCO}$, in which "%" denotes the modulo function such that $T_{MOD}\in(0, T_{VCO})$. $T_{MOD}$ is directly related to the phase factor so that changes of $T_{MOD}$ also changes the value of $\Delta f_{vco}$ in open loop as shown in FIG. 8. The number of DELAY steps is determined to add the delay interval $T_{COMP}$ resulting in the corresponding compensated phase factor $T_{PHPA2VCO}$. In this manner, the propagation delay is adjusted to reposition the phase factor back into region A so that $\Delta f_{vco}$ in open loop is adjusted to mitigate PA-VCO coupling interference.

FIG. 10 is a simplified block diagram of the delay controller 130 interfaced with the processing circuitry 132 according to one embodiment of the present disclosure. The delay controller 130 includes the calibration offset memory 1002, the temperature offset memory 1004, and a combiner 1006. Although the calibration offset memory 1002 and the temperature offset memory 1004 are shown as two separate memories, the stored information may be stored within the same memory. The calibration offset memory 1002 stores at least one calibration offset including one calibration offset for each applicable frequency band of operation. As shown, a first calibration offset CAL_FB1 is shown for a first frequency band up to a last calibration offset CAL_FBM for a last frequency band in which M is any suitable integer of 0 or more. As an example, calibration of a Zigbee transmitter may be performed once for the 800 MHz frequency band (e.g., 868 MHz) to provide CAL_FB1 and again for the 900 MHz frequency band (e.g., 915 MHz) to provide a second calibration offset CAL_FB2 (not shown). Any number of calibration offset values may be stored depending upon the applicable number of operating frequency bands. It is noted, for example, that only 1 calibration offset may be needed for 2.4 GHz Wi-Fi, such as one calibration performed at 2440 MHz that falls in the middle of the overall operating frequency band between 2400 MHz and 2480 MHz.

The processing circuitry 132 determines the frequency band applicable for transmission and outputs an FBAND value to the calibration offset memory 1002. The calibration offset memory 1002 selects the corresponding calibration offset value, and outputs the selected calibration offset value as a value CAL to one input of the combiner 1006. It is noted that if only one calibration offset is determined, such as Wi-Fi for example, then the sole calibration offset value may be programmed as CAL and the processing circuitry 132 need not provide the FBAND value.

The temperature offset memory 1004 stores a set of temperature offset values each corresponding to a temperature subrange within the overall temperature operating range. As shown in FIG. 9, for example, the DELAY offset value for compensating an uncompensated propagation delay $T_{PROP}$ to provide a compensated phase factor $T_{PHPA2VCO}$ is a temperature offset value. Each temperature subrange has any suitable size, such as 5° C. or 10° C. as shown in FIG. 9. In other words, a different temperature offset value is provided for each sequential subrange. The temperature subrange may be any suitable value so long as it enables compensated modulo delay values outside of the C region. The overall temperature operating range depends on the configuration and corresponding application. For most commercial applications, the overall temperature operating range may be from a low temperature value of −40° C. to a high temperature value of 125° C. or 135° C. or the like. As shown in FIG. 9, 19 different temperature offsets are provided for an overall temperature operating range of −40° C. to 135° C. with a temperature subrange of about 10° C.

In one embodiment, the temperature offset memory 1004 is stored as a lookup table (LUT). The processing circuitry 132 receives the TEMP value indicative of the actual temperature, and outputs a corresponding temperature select value T_SEL to the temperature offset memory 1004. The temperature offset memory 1004 outputs the selected temperature offset as a temperature offset value T_OFF to another input of the combiner 1006. For an LUT configuration, T_SEL may be an index value.

Each of the calibration offset values are determined for a particular frequency within each of one or more frequency bands as further described herein. Yet each frequency band may include multiple channels with corresponding channel frequencies, so that a channel frequency offset FQ_OFF is determined to adjust for a frequency differential between the calibrated value and the actual frequency of transmission at any given time. The adjustment of frequency is deterministic, so that rather than store a separate frequency adjust value for each channel, the processing circuitry 132 calculates the frequency adjust value FQ_OFF based on a difference between the frequency with which the CAL value was determined and the actual frequency of transmission at any given time. Thus, the FQ_OFF value is calculated and output to another input of the combiner 1006.

As an example of how the processing circuitry 132 may determine a channel frequency offset FQ_OFF, assume that calibration is performed at a VCO mid-frequency $F_{VCO\_MID}$ (also referred to as a calibration frequency) at a mid-temperature level for a transmitter having a propagation delay $T_{delay}$ from the VCO to the PA (in which $T_{delay}$ is a shortened version of $T_{delay,vco-pa}$). The "mid" notation simply means that calibration is performed at or near the center of a frequency range of different frequency channels that may be used by the transmitter. For example, for a channel frequency range of 902 MHz to 930 MHz, a mid-frequency of 915 MHz may be chosen for calibration. Also, the mid notation means that calibration is performed at a selected mid-temperature value that is suitable for performing calibration, such as at or near room temperature. It is desired that $T_{delay}$ divided by the corresponding VCO period $T_{VCO\_MID}$ remain equal to a constant value K, or $T_{delay}/T_{VCO\_MID}=K$. This means that $T_{delay}$ multiplied by $F_{VCO\_MID}$ is also equal to K, or $T_{delay}\cdot F_{VCO\_MID}=K$. It is desired to determine a delay adjustment $\Delta T_{delay}$ corresponding with an adjusted propagation delay $T'_{delay}$ for a channel VCO frequency $F'_{VCO}$ at a selected channel frequency.

The adjusted propagation delay $T'_{delay}$ divided by the channel VCO period $T'_{VCO}$ should also equal K, or $T'_{delay}/T'_{VCO}=K$. The channel VCO period $T'_{VCO}$ is related to the mid-frequency as $T'_{VCO}=1/(F_{VCO\_MID}+\Delta f_{VCO})$ in which $\Delta f_{VCO}$ is the difference between the mid-frequency used for calibration and the channel frequency. Thus, the adjusted propagation delay $T'_{delay}$ may be calculated as $T'_{delay}=K/(F_{VCO\_MID}+\Delta f_{VCO})=T_{delay}\cdot F_{VCO\_MID}/(F_{VCO\_MID}+\Delta f_{VCO})$. Finally, the delay adjustment $\Delta T_{delay}=T'_{delay}-T_{delay}=T_{delay}\cdot(-\Delta f_{VCO})/(F_{VCO\_MID}+\Delta f_{VCO})$.

For example, if a transmitter has an uncompensated propagation delay $T_{PROP}$ of 1032 ps and is calibrated at 915 MHz to provide a compensation delay value CAL=1=17 ps, then the calibrated propagation delay $T_{delay}=T_{PROP}+T_{COMP}=1049$ ps. For the channel frequency 902 MHz, $F_{VCO\_MID}=915$ MHz·6=5490 MHz, and $\Delta f_{VCO}=(902-915)$ MHz·=−78 MHz. $\Delta T_{delay}=T_{delay}\cdot(-\Delta f_{VCO})/(F_{VCO\_MID}+\Delta f_{VCO})=1049$ ps(78 MHz)/(5490 MHz−78 MHz)=15.1 ps. Since in this case each delay step is about 17 ps, then the channel frequency offset FQ_OFF=1.

A similar calculation may be performed for 930 MHz, in which $\Delta T_{delay}=-16.9$ ps which corresponds with a channel frequency offset FQ_OFF=−1. It is noted, therefore, that calibration may be performed at a selected mid-frequency and at a selected mid-temperature to determine the corresponding calibration value CAL, and that FQ_OFF may be calculated by the processing circuitry 132 for the particular channel frequency used for transmission.

The combiner 1006 combines the CAL, T_OFF, and FQ_OFF values together (such as by adding in this example, though alternative mathematical functions are contemplated) and performs a modulo function (CAL+T_OFF+FQ_OFF) % D to determine the delay select value provided to the delay circuit. When the delay circuit is configured as the delay circuit 116 shown in FIG. 5 with up to D=8 different delay steps (including 0), then the modulo function is (CAL+T_OFF+FQ_OFF) % 8 and the delay select value DSEL<2:0> ranges from 0 to 7. In this manner, the delay circuit 116 is programmed by the delay controller 130 to calibrate for the particular configuration (CAL value) at a selected frequency and temperature, to compensate for a temperature difference, and to compensate for a frequency difference. It is noted that one or more of the offset values may be a negative value. The modulo function ensures that the added delay value is always positive.

FIG. 11 is a flowchart diagram illustrating a characterization process for determining the temperature offsets to be stored in the temperature offset memory 1004 according to one embodiment of the present disclosure. At a first block 1102, the test apparatus measures the relative delay across the entire applicable operating temperature range of a selected set of semiconductor chips representative of a batch of semiconductor chips. It is noted that not every chip in a given batch may be characterized; instead only a selected subset are characterized to represent the entire batch of the same-type chip. At the next block 1104, the temperature offsets are programmed into the temperature offset memory 1004 and operation is completed.

It is noted that characterization is not the same as calibration, which is described further herein. Instead, the temperature offsets programmed into the temperature offset memory 1004 may be relative to a selected temperature value, such as a mid-temperature value of 35° C. or any other suitable representative temperature value. A representative temperature at or near room temperature is advantageous for testing. It is assumed that calibration is to be performed at the representative temperature, so that the temperature offset for every other temperature subrange is relative to the representative temperature value. In other words, the temperature offsets are made relative to the representative mid-temperature value, which is calibrated during the calibration procedure.

FIG. 12 is a flowchart diagram of a calibration procedure of the transmitter circuit 100 according to one embodiment of the present disclosure. At a first block 1202, the PA 120 of the transmitter circuit 100 is operated at maximum power, at the representative or mid-temperature value (e.g., 25° C. or 35° C. or at any other suitable temperature level), and at a mid-frequency level within a first frequency band. For example, for 800 MHz band, the selected frequency may be 868 MHz, for 900 MHz band, the selected frequency may be 915 MHz, and for 2.4 GHz, the selected frequency may be 2440 MHz.

At next block 1204, the delay settings of the delay circuit 116 are swept through each discrete value of DSEL while monitoring the voltage level and variations of $V_{ctrl}$. As previously described, $V_{ctrl}$ may be sensed as $V_{ctrl\_s}$ as sampled by the ADC 140. If the PLL 112 is instead a digital design, then the ADC 140 may be omitted since the digital word from the digital loop filter may be directly monitored. In addition, or in the alternative, the delay settings are swept while monitoring the phase noise (PN) such as by using a PN signal analyzer or the like (not shown) coupled at a port of the antenna 124. At next block 1206, the delay setting that achieves the minimum $\Delta V_{ctrl}/\Delta DELAY$ and/or the minimum $\Delta PN/\Delta DELAY$ is selected as the CAL_FB value for that frequency band. At next block 1208, the determined CAL_FB value is stored into the calibration offset memory 1202.

At next block 1210, it is queried whether another frequency band should be calibrated. If so, operation loops back to block 1202 to repeat the entire procedure for determining the CAL_FB value for the next frequency band, which is then stored into the calibration offset memory 1002. When there are no further frequency bands to test or if there is only one frequency band (e.g., Wi-Fi at 2.4 GHz) as determined at block 1210, then operation is completed. In this manner, each CAL_FB stored into the calibration offset memory 1002 calibrates the transmitter circuit 100 for a mid-frequency value within the applicable frequency band and at a mid-temperature value.

Figure 13:
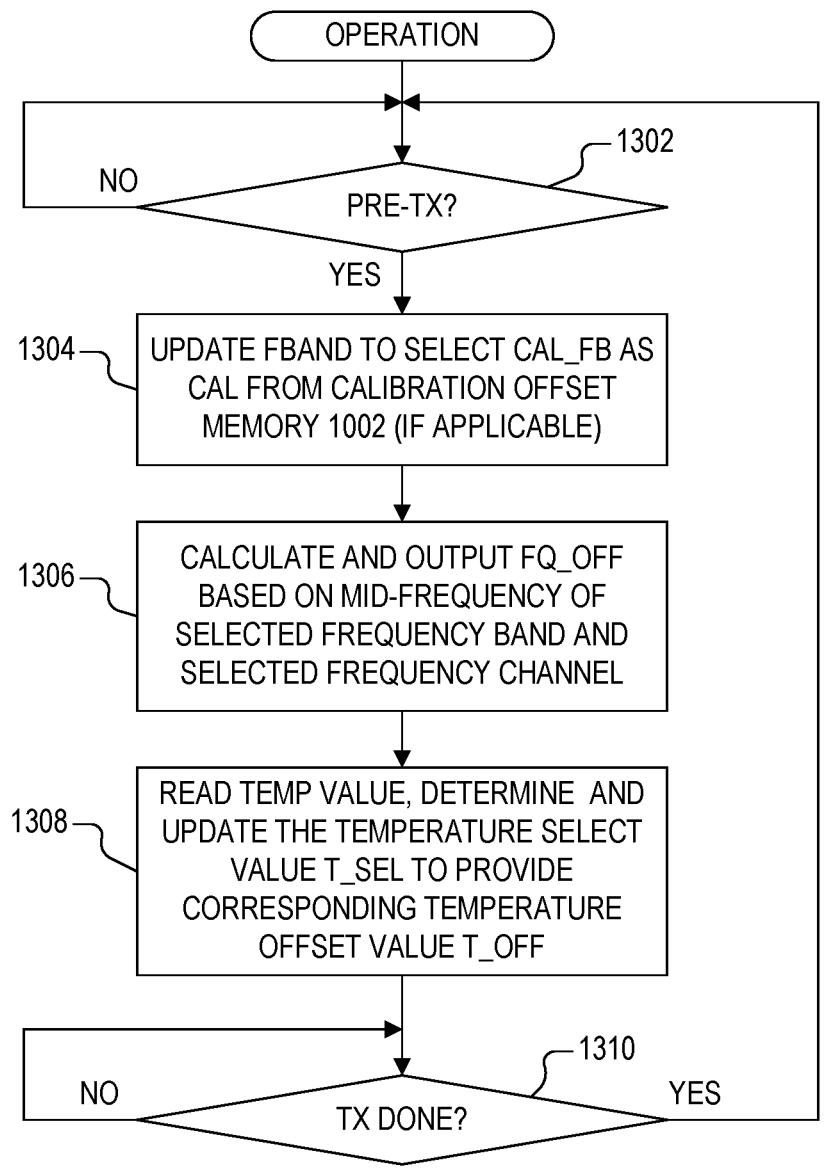
FIG. 13 is a flowchart diagram illustrating normal operation of the transmitter circuit of FIG. 1 for updating the calibration and offset values of the delay controller of FIG. 10 to update the delay implemented by the delay circuit of FIG. 1 prior to each transmission.

FIG. 13 is a flowchart diagram illustrating normal operation of the transmitter circuit 100 for updating the calibration and offset values of the delay controller 130 to update the delay implemented by the delay circuit 116 prior to each transmission. At a first block 1302, it is queried whether the transmitter circuit 100 is about to transmit, referred to as PRE-TX. If not, operation loops back and waits for the next transmission. When the transmitter circuit 100 is about to transmit, operation advances to block 1304 in which the processing circuitry 132 updates the FBAND value provided to the calibration offset memory 1002 to select a corresponding CAL_FB value as the CAL offset (e.g., selected one of CAL_FB1, . . . , CAL_FBM). If there is only one applicable FBAND and corresponding CAL_FB value, then it is provided as CAL and this step may be omitted. At next block 1306, the processing circuitry 132 calculates the frequency offset value FQ_OFF as previously described based on the mid-frequency of the applicable frequency band used for calibration and the selected frequency channel applicable for transmission.

At next block 1308, the processing circuitry 132 reads the TEMP value, and then determines and updates the temperature select value T_SEL provided to the temperature offset memory 1004 for outputting the corresponding temperature offset value T_OFF. In an alternative embodiment in which the temperature offset memory 1004 is not implemented as an LUT, the processing circuitry 132 simply addresses the corresponding temperature offset provided as the T_OFF value. At next block 1310, operation loops until the current packet transmission operation is completed, and then operation loops back to block 1302 to wait until the next transmission.

It is noted that hysteresis may be implemented by the processing circuitry 132 (such as programmed in firmware of a processor or incorporated in a finite state machine or the like) or the delay controller 130 between successive subranges of the temperature values to avoid jumping between 2 sequential temperature subranges. In one embodiment, a small overlap may be configured before transitioning from one subrange to another, and the same or similar overlap applies in the opposite direction. For example, operation may transition from the 15° C. subrange to the 25° C. subrange when temperature is rising only when TEMP indicates 25.5° C., but may transition back to the 15° C. subrange when temperature is falling only when TEMP indicates 14.5° C.

The present description has been presented to enable one of ordinary skill in the art to make and use the present invention as provided within the context of particular applications and corresponding requirements. The present invention is not intended, however, to be limited to the particular embodiments shown and described herein, but is to be accorded the widest scope consistent with the principles and novel features herein disclosed. Many other versions and variations are possible and contemplated. Those skilled in the art should appreciate that they can readily use the disclosed conception and specific embodiments as a basis for designing or modifying other structures for providing the same purposes of the present invention without departing from the spirit and scope of the invention.

The invention claimed is:

1. A transmitter, comprising:
a frequency synthesizer comprising a voltage-controlled oscillator having an input receiving a control voltage and having an output providing a modulated constant-envelope oscillating signal;
at least one frequency divider, coupled to the voltage-controlled oscillator for receiving the modulated constant-envelope oscillating signal, that divides down a frequency of the modulated constant-envelope oscillating signal by an integer factor and that outputs a local modulated constant-envelope oscillating signal;
a programmable delay circuit, coupled to the at least one frequency divider for receiving the local modulated constant-envelope oscillating signal, that delays the local modulated constant-envelope oscillating signal and that outputs a delayed local modulated constant-envelope oscillating signal;
a driver circuit having an input coupled to the programmable delay circuit for receiving the delayed local modulated constant-envelope oscillating signal and having an output;
a power amplifier having an input coupled to the output of the driver circuit, wherein the power amplifier is configured to amplify the delayed local modulated constant-envelope oscillating signal for transmission via an antenna at a power level sufficient to produce interference of the control voltage caused by magnetic coupling from the power amplifier to the voltage-controlled oscillator; and
a delay controller that programs the delay circuit with a delay time that remains unmodified during the transmission, wherein the delay time is selected for the transmission to reduce a rate of change of the control voltage of the voltage-controlled oscillator as a function of delay to correspondingly reduce the interference of the control voltage caused by the magnetic coupling from the power amplifier to the voltage-controlled oscillator during the transmission;
wherein the transmitter, including the frequency synthesizer, the voltage-controlled oscillator, the at least one frequency divider, the programmable delay circuit, the driver circuit, the power amplifier, and the delay controller, is integrated on a semiconductor chip.

2. The transmitter of claim 1, wherein the delay circuit is digitally programmed to select an integer number of delay steps, and wherein a total number of delay steps and a duration of each delay step is determined based on a period of the oscillating signal for each of multiple oscillation frequencies of operation.

3. The transmitter of claim 1, wherein the delay controller programs the delay circuit to reduce control voltage change of the voltage-controlled oscillator as a function of delay change.

4. The transmitter of claim 1, wherein the delay controller programs the delay circuit to reduce phase noise degradation at an output of the transmitter as a function of delay change.

5. The transmitter of claim 1, wherein the delay controller adjusts the delay circuit based on a propagation delay between the voltage-controlled oscillator and the power amplifier and a frequency of the voltage-controlled oscillator.

6. The transmitter of claim 1, wherein the delay controller adjusts the delay circuit based on a detected operating temperature.

7. The transmitter of claim 1, wherein the delay controller combines a calibration value with a channel frequency offset and a temperature offset to determine a delay select value used to program the delay circuit.

8. The transmitter of claim 1, wherein the delay controller comprises:
a memory that stores a plurality of temperature offsets based on detected temperature; and
a combiner that combines a calibration value to a selected one of the plurality of temperature offsets and to a frequency offset to provide a delay select value used to program the delay circuit.

9. The transmitter of claim 8, wherein the memory stores a plurality of calibration values each determined by a corresponding one of a plurality of frequency bands of transmission, and wherein one of the plurality of calibration values is selected based on a selected one of the plurality of frequency bands of transmission.

10. The transmitter of claim 8, further comprising processing circuitry that calculates and provides the frequency offset based on a calibrated propagation delay between the voltage-controlled oscillator and the power amplifier and a frequency difference between a channel frequency and a calibration frequency used to determine the calibrated propagation delay.

11. The transmitter of claim 8, further comprising processing circuitry that selects from among the plurality of temperature offsets based on detected temperature.

12. The transmitter of claim 8, wherein the plurality of temperature offsets are determined based on measuring delay across an applicable operating temperature range relative to a calibration temperature and an incremental delay step.

13. A method of mitigating interference in a transmitter caused by magnetic coupling from a power amplifier to a voltage-controlled oscillator, the method comprising:
providing the transmitter, including the voltage-controlled oscillator and the power amplifier, on a semiconductor chip;
generating, by the voltage-controlled oscillator, a modulated constant-envelope oscillating signal based on a control voltage;
dividing down a frequency of the modulated constant-envelope oscillating signal by an integer factor and providing a local modulated constant-envelope oscillating signal;
delaying the local modulated constant-envelope oscillating signal by a programmable delay time for providing a delayed local modulated constant-envelope oscillating signal, wherein the delay time remains unmodified during transmission and is selected for the transmission to reduce a rate of change of the control voltage as a function of delay to correspondingly reduce interference of the control voltage caused by magnetic coupling from the power amplifier to the voltage-controlled oscillator during the transmission; and
driving the delayed local modulated constant-envelope oscillating signal to an input of the power amplifier configured to amplify the delayed local modulated constant-envelope oscillating signal for the transmission via an antenna at a power level sufficient to produce the interference of the control voltage caused by magnetic coupling from the power amplifier to the voltage-controlled oscillator.

14. The method of claim 13, wherein the delaying comprises selecting an integer number of delay steps in which a total number of delay steps and a duration of each delay step is determined based on a period of the oscillating signal for each of multiple oscillation frequencies of operation.

15. The method of claim 13, wherein the delaying comprises delaying to reduce a control voltage change of the voltage-controlled oscillator as a function of delay change.

16. The method of claim 13, wherein the delaying comprises delaying to reduce a phase noise degradation at an output of the transmitter as a function of delay change.

17. The method of claim 13, wherein the delaying comprises delaying based on a propagation delay between the voltage-controlled oscillator and the power amplifier and a frequency of the voltage-controlled oscillator.

18. The method of claim 13, wherein the delaying comprises delaying based on a detected operating temperature.

19. The method of claim 13, wherein the delaying comprises combining a calibration value with a channel frequency offset and a temperature offset.

20. The method of claim 13, wherein the delaying comprises:
selecting a temperature offset based on a temperature value indicative of detected temperature;
calculating a frequency offset based on a propagation delay between the voltage-controlled oscillator and the power amplifier at a calibration frequency and a difference between the calibration frequency and a channel frequency; and
combining the temperature offset and the frequency offset with a calibration value.

21. A transmitter, comprising:
an L-C based oscillator having an input receiving a control value and having an output providing a modulated constant-envelope oscillating signal;
at least one frequency divider that divides down a frequency of the modulated constant-envelope oscillating signal by an integer factor to provide a local modulated constant-envelope oscillating signal;
a programmable delay circuit that delays the local modulated constant-envelope oscillating signal to provide a delayed local modulated constant-envelope oscillating signal;
a driver circuit that drives the delayed local modulated constant-envelope oscillating signal to an input of a power amplifier configured to amplify the delayed local modulated constant-envelope oscillating signal for transmission via an antenna at a power level sufficient to produce interference of the control value caused by magnetic coupling from the power amplifier to the L-C based oscillator; and
a delay controller that programs the delay circuit with a delay time that remains unmodified during the transmission, wherein the delay time is selected for the transmission to reduce a rate of change of the control value of the L-C based oscillator as a function of delay to correspondingly to reduce the interference caused by magnetic coupling from the power amplifier to the L-C based oscillator during the transmission;
wherein the transmitter, including the L-C based oscillator, the at least one frequency divider, the programmable delay circuit, the driver circuit, the power amplifier, and the delay controller, is integrated on a semiconductor chip.

22. The transmitter of claim 21, wherein the delay controller programs the delay circuit to reduce phase noise degradation at an output of the transmitter as a function of delay change.

23. The transmitter of claim 21, wherein the L-C based oscillator comprises a digitally controlled oscillator.

24. The transmitter of claim 23, wherein the delay controller programs the delay circuit to reduce digital control word change of the digitally controlled oscillator as a function of delay change.

25. The transmitter of claim 23, wherein the delay controller adjusts the delay circuit based on a propagation delay between the digitally controlled oscillator and the power amplifier and a frequency of the digitally controlled oscillator.

* * * * *